(12) United States Patent
Hsu et al.

(10) Patent No.: US 6,693,045 B2
(45) Date of Patent: Feb. 17, 2004

(54) HIGH DENSITY WAFER PRODUCTION METHOD

(75) Inventors: Tsung-Ping Hsu, Tao-Yuan Hsien (TW); In-Yao Lee, Taipei Hsien (TW); Hung-Sheng Hu, Kao-Hsiung (TW); Chung-Cheng Chou, Taipei (TW); Wei-Lin Chen, Taipei (TW)

(73) Assignee: BenQ Corporation, Tao-Yuan Hsien (TW)

( * ) Notice: Subject to any disclaimer, the term of this patent is extended or adjusted under 35 U.S.C. 154(b) by 0 days.

(21) Appl. No.: 09/683,692

(22) Filed: Feb. 4, 2002

(65) Prior Publication Data

US 2002/0123232 A1 Sep. 5, 2002

(30) Foreign Application Priority Data

Mar. 2, 2001 (TW) ........................................ 90104928 A (51) Int. Cl.$^7$ ................................................ H01L 21/00
(52) U.S. Cl. .................. 438/745; 216/27; 216/56; 216/100; 438/751; 438/754; 438/756; 438/757
(58) Field of Search .................... 438/733, 745, 438/750, 751, 754, 756, 757; 216/27, 39, 56, 100

(56) References Cited

U.S. PATENT DOCUMENTS

| 4,372,803 A | * | 2/1983 | Gigante .................. 438/751 X |
| 4,957,592 A | | 9/1990 | O'Neill |
| 5,316,618 A | * | 5/1994 | van Lintel ............... 438/751 X |
| 5,994,160 A | | 11/1999 | Niedermann et al. |
| 6,137,511 A | | 10/2000 | Furuhata et al. |

FOREIGN PATENT DOCUMENTS

JP   57095633 A   6/1982

* cited by examiner

*Primary Examiner*—William A. Powell
(74) *Attorney, Agent, or Firm*—Winston Hsu (57) ABSTRACT

A gradational etching method for high density wafer production. The gradational etching method acts on a substrate having a first passivation layer and a second passivation layer on a top surface and a bottom surface, respectively, of the substrate. A first etching process is performed to simultaneously etch the substrate and the first passivation layer to remove the first passivation layer. Finally, a second etching process is performed to etch the substrate to a designated depth that is used to control the thickness of the wafer after the second etching process.

20 Claims, 10 Drawing Sheets

| Term \ Wafer size | $T_1$ | $T_3$ | $L_4$ | $L_5$ | $W_1$ | $W_2$ | $(W_2/W_1) \times 100\%$ |
|---|---|---|---|---|---|---|---|
| 4" | 450 | 400 | 1370 | 1765 | 7400 | 7260 | 98.1 |
| 4" | 450 | 300 | 1188 | 1694 | 7400 | 6975 | 94.2 |
| 4" | 450 | 200 | 1047 | 1623 | 7400 | 6693 | 90.4 |
| 6" | 675 | 500 | 1153 | 1677 | 7400 | 6905 | 93.3 |
| 6" | 675 | 400 | 1012 | 1606 | 7400 | 6622 | 89.5 |
| 6" | 675 | 200 | 729 | 1465 | 7400 | 6056 | 81.8 |
| 8" | 725 | 600 | 1224 | 1712 | 7400 | 7046 | 95.2 |
| 8" | 725 | 400 | 940 | 1570 | 7400 | 6481 | 87.6 |
| 8" | 725 | 200 | 658 | 1430 | 7400 | 5915 | 79.9 |
| 12" | 800 | 600 | 1117 | 1660 | 7400 | 6834 | 92.3 |
| 12" | 800 | 400 | 835 | 1518 | 7400 | 6268 | 84.7 |
| 12" | 800 | 200 | 552 | 1376 | 7400 | 5703 | 77.1 |

Unit: $\mu m$

Fig. 8

| Wafer size \ Term | $T_1$ | $T_3$ | $L_4$ | $L_5$ | $W_1$ | $W_3$ | $(W_3/W_1) \times 100\%$ |
|---|---|---|---|---|---|---|---|
| 4" | 450 | 400 | 1370 | 1765 | 10000 | 9788 | 97.9 |
| | 450 | 300 | 1188 | 1694 | 10000 | 9363 | 93.6 |
| | 450 | 200 | 1047 | 1623 | 10000 | 8940 | 89.4 |
| 6" | 675 | 500 | 1153 | 1677 | 10000 | 9258 | 92.3 |
| | 675 | 400 | 1012 | 1606 | 10000 | 8833 | 88.3 |
| | 675 | 200 | 729 | 1465 | 10000 | 7985 | 79.8 |
| 8" | 725 | 600 | 1224 | 1712 | 10000 | 9470 | 94.7 |
| | 725 | 400 | 940 | 1570 | 10000 | 8621 | 86.2 |
| | 725 | 200 | 658 | 1430 | 10000 | 7773 | 77.7 |
| 12" | 800 | 600 | 1117 | 1660 | 10000 | 9151 | 91.5 |
| | 800 | 400 | 835 | 1518 | 10000 | 8303 | 83.0 |
| | 800 | 200 | 552 | 1376 | 10000 | 7454 | 74.5 |

Unit: $\mu m$

Fig. 9

| Wafer size | Term $T_1$ | $T_3$ | $L_4$ | $L_5$ | $W_1$ | $W_4$ | $(W_4/W_1) \times 100\%$ |
|---|---|---|---|---|---|---|---|
| 4" | 450 | 400 | 1370 | 1765 | 17800 | 17376 | 97.6 |
|  | 450 | 300 | 1188 | 1694 | 17800 | 16527 | 92.8 |
|  | 450 | 200 | 1047 | 1623 | 17800 | 15680 | 88.1 |
| 6" | 675 | 500 | 1153 | 1677 | 17800 | 16315 | 91.6 |
|  | 675 | 400 | 1012 | 1606 | 17800 | 15467 | 86.9 |
|  | 675 | 200 | 729 | 1465 | 17800 | 13770 | 77.3 |
| 8" | 725 | 600 | 1224 | 1712 | 17800 | 16740 | 94.0 |
|  | 725 | 400 | 940 | 1570 | 17800 | 15043 | 84.5 |
|  | 725 | 200 | 658 | 1430 | 17800 | 13346 | 74.9 |
| 12" | 800 | 600 | 1117 | 1660 | 17800 | 16103 | 90.4 |
|  | 800 | 400 | 835 | 1518 | 17800 | 14406 | 80.9 |
|  | 800 | 200 | 552 | 1376 | 17800 | 12710 | 71.4 |

Unit : $\mu m$

Fig. 10

HIGH DENSITY WAFER PRODUCTION METHOD

BACKGROUND OF INVENTION

1. Field of the Invention

The present invention relates to a wafer production method used in an etching process of a substrate, and more particularly, to a high density wafer production method for controlling a thickness of the wafer.

2. Description of the Prior Art

Silicon substrates are presently widely used in integrated circuits, optical electronics, microelectronics and microelectromechanical systems (MEMS). However, silicon substrates have shortcomings in many applications. For example, silicon substrates are crystal materials with crystal directions. Anisotropic etching processes are performed on silicon substrates by using a potassium hydroxide (KOH) solution. The etching speed of silicon in the direction <100> and <110> is far faster than that in the direction of <111> for forming an inclined plan with 54.74°, creating a large waste of space. The waste of space becomes more serious with an increasing thickness of the silicon substrate.

Figure 1:
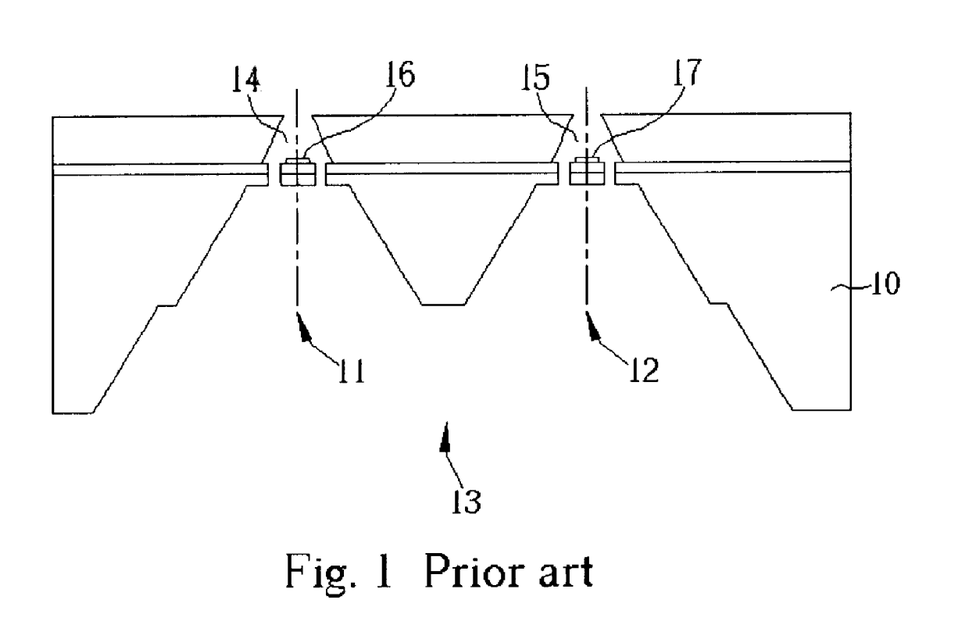
FIG. 1 to FIG. 2 are views of an ejecting apparatus according to the prior art.
Figure 2:
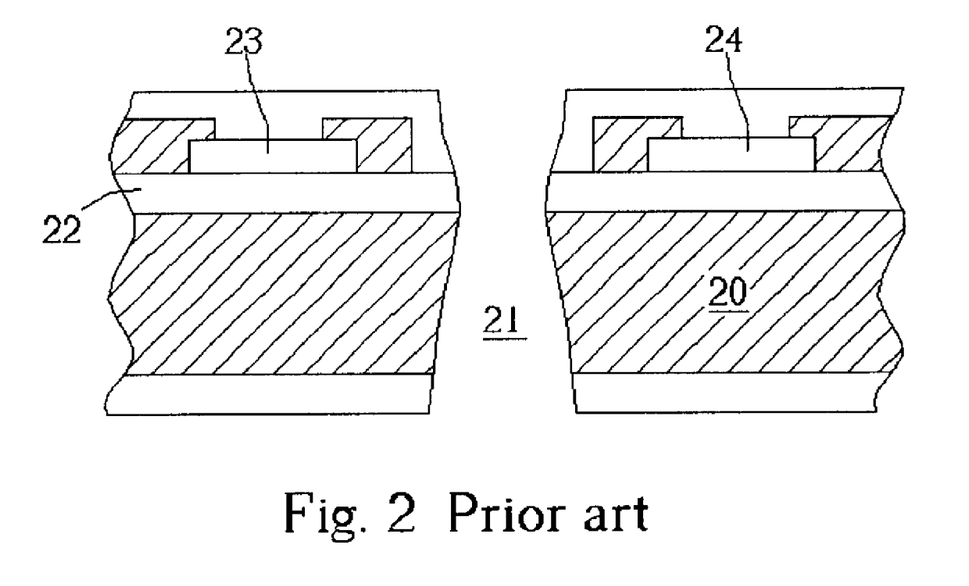
Figure 3:
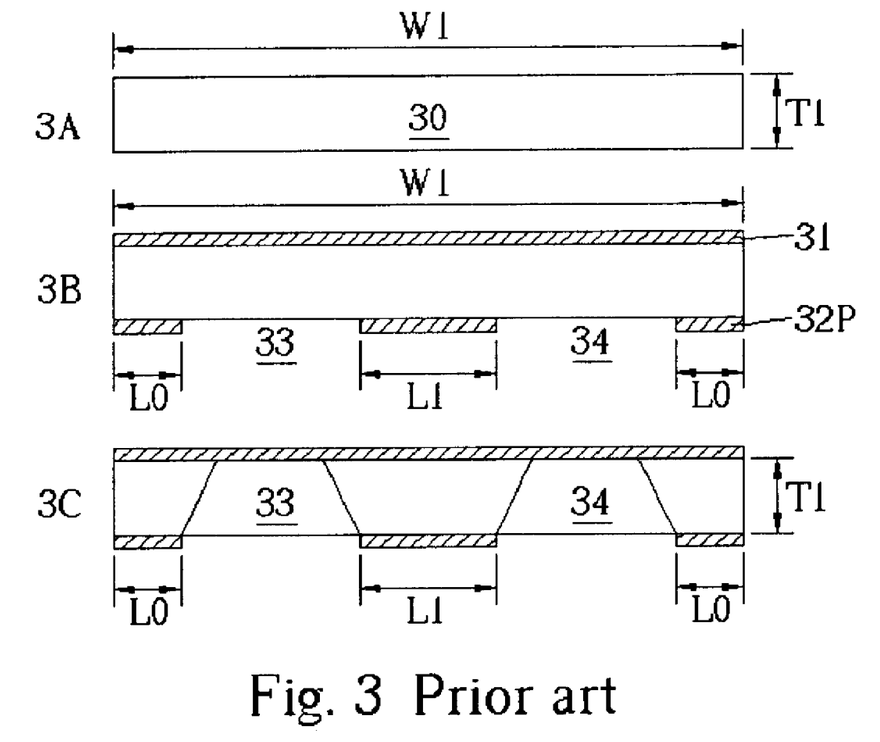
FIG. 3 is a view of a process according to the prior art.

Please refer to FIGS. 1 through FIG. 3, which are diagrams of print head structures of the prior art. FIG. 1 is disclosed in U.S. Pat. No. 6,019,907 "Forming refill for monolithic inkjet printhead". As shown in FIG. 1, the prior art inkjet printhead is formed on a silicon substrate 10 comprising two slots 11,12 for passing ink, two nozzle chambers 14,15 located on the surface of slots 11,12 for jetting the ink, and two resistors 16,17. The resistor 16 is located between the nozzle chamber 14 and the slot 11, and the resistor 17 is located between the nozzle chamber 15 and the slot 12 for heating the ink. The slots 11,12 form a refilling chamber 13 for decreasing the turbulent effect.

FIG. 2 is disclosed in U.S. Pat. No. 5,658,471 "Fabrication of thermal ink-jet feed slots in a silicon substrate." As shown in FIG. 2, the prior art inkjet printhead is formed on a silicon substrate 20 comprising slot 21 formed in the center of the substrate 20 for passing the ink, a dielectric layer 22 formed on the surface of the substrate 20, and two heaters 23,24 formed on the surface of the dielectric layer 22 for heating the ink. The dielectric layer 22 isolates the substrate 22 from the heaters 23,24. The structures shown in FIG. 1 and FIG. 2 are different, but they are manufactured by similar processes, and both waste space.

Please refer to FIG. 3, which shows a prior art inkjet printhead formed on a silicon substrate. As shown in FIG. 3, a standard cleaning process is performed on a silicon substrate with a width $W_1$ and a thickness $T_1$. A passivation layer 31 and a patterned passivation layer 32P are formed on a top surface and a bottom surface of a silicon substrate 30 for forming the surface patterns of slots 33,34. A distance between the slot 33 and the slot 34 is $L_1$ and a distance between slots 33,34 and the wafer edge is $L_0$. An etching process is performed on the silicon substrate by using potassium hydroxide (KOH) solution to form the structure of the slots 33,34, as shown in FIG. 3. The passivation layers 31,32P are composed of silicon oxide or silicon nitride.

The process of FIG. 3 applied in FIG. 1 and FIG. 2 for producing the inkjet printhead forms an inclined plane at 54.74°, creating a large waste of space. Additionally, the substrate needs sufficient space in $L_0$ and $L_1$ (as shown in FIG. 3) to glue an ink box (not shown). An inclined plane formed at 54.74°, and the space required for gluing the box lead to the creation of a large waste of space.

SUMMARY OF INVENTION

It is therefore a primary objective of the present invention to provide a method of high density wafer production that saves space.

Briefly, the claimed invention provides an etching method for high density wafer production used when etching a substrate for controlling a thickness of the wafer. The etching method forms a first patterned passivation layer and a second passivation layer on a top surface and a bottom surface, followed by performing a first etching process for simultaneously etching the substrate and the first passivation layer. After the first passivation layer is removed, a second etching process is performed to etch the substrate to a designated depth that is used to control the thickness of the wafer after the second etching process.

It is an advantage of the present invention that the etching method controls the thickness of the wafer and the size of slots for inkjet printhead and MicroElectroMechanical Systems applications.

These and other objectives and advantages of the present invention will no doubt become obvious to those of ordinary skill in the art after having read the following detailed description of the preferred embodiment that is illustrated in the various figures and drawings.

DETAILED DESCRIPTION

FIGS. 4 to FIG. 7 are views of a gradational etching method according to the present invention. Please refer to FIG. 4A. The present invention provides a silicon substrate 40 having the same width $W_1$ and thickness $T_1$ as the silicon substrate 30 in FIG. 3 has. A standard cleaning process is performed on the silicon substrate 40. Please refer to FIG. 4B. A passivation layer 41 and a patterned passivation layer 42P are formed on a top surface and a bottom surface of the silicon substrate 40 for forming the surface pattern of slots 43,44, which are of the same size as slots 33,34 in FIG. 3. The etching speeds of passivation layer 41 and the passivation layer 42P are different for the same etching solution. The silicon substrate in the present invention is used in an inkjet printhead, so that the slots 43,44 are used for passing ink in the inkjet printhead. Also, the silicon substrate in the present invention can be substituted by glass, ceramics, metal, or semiconductor crystal.

Figure 4:
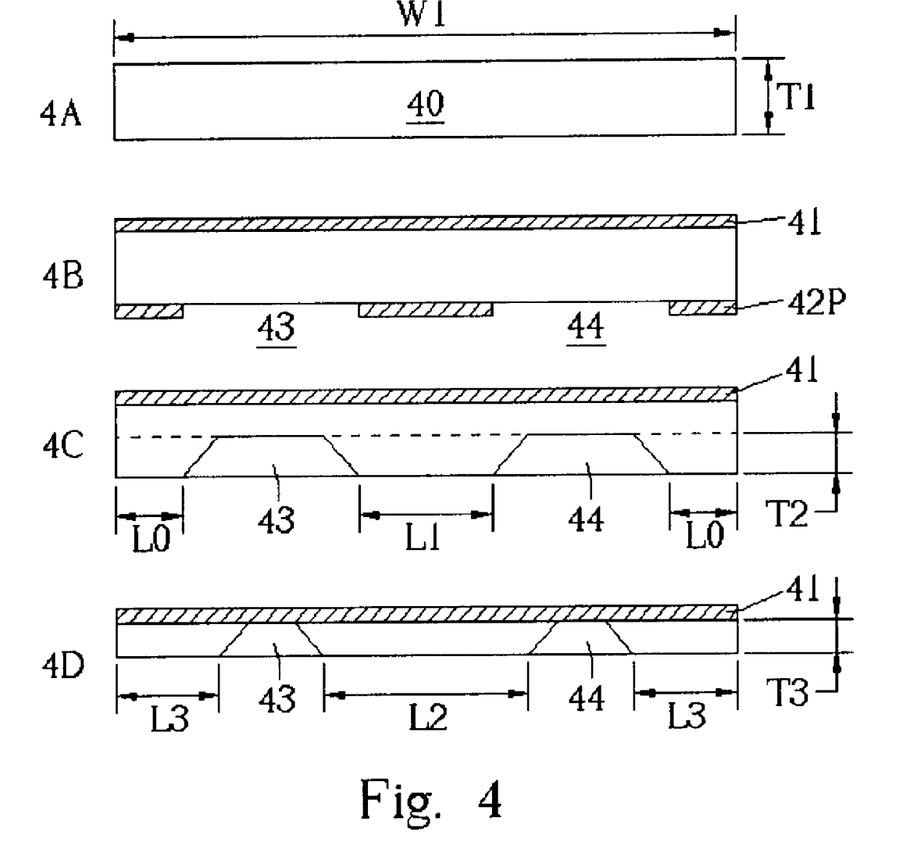
FIG. 4 is a view of a process according to the present invention high density wafer production method.

Please refer to FIG. 4C. An etching process is performed on the silicon substrate 40 using potassium hydroxide (KOH) for etching the silicon substrate 40 and the passivation layer 42P simultaneously. The etching speed of the silicon substrate 40 is faster than the etching speed of the passivation layer 42P. When the silicon substrate 40 is etched to the thickness $T_2$ (as shown in FIG. 4), the passivation layer 42P is removed and the passivation layer 41 is reserved. Please refer to FIG. 4D. An etching process is performed subsequently on the silicon substrate 40 and through the silicon substrate 40 from back to front, so as to get a structure with substrate thickness $T_3$ ($T_3<T_1$) and two slots 43,44. The distance between the slot 43 and the slot 44 is $L_2$ and the distance between the slots 43,44 and the wafer edge is $L_3$. The passivation layers 41,42P are made of metal, ceramics or large molecular compounds. If the passivation layer 41 and the passivation layer 42P are composed of the same material, the passivation layer 41 is thicker than the passivation layer 42P. If the passivation layer 41 and the passivation layer 42P are composed of different materials, the etching speed of 42P is faster than the etching speed of the passivation layer 41. Additionally, the etching process described before can be substituted with a wet etching process, a dry etching process, or a mechanical process. The etching processes in FIG. 4C and FIG. 4D can alternatively be an isotropic etching process.

In contrast to the prior art, the method of the present invention increases the distance $L_2$ between 43,44 ($L_2>L_1$) and the distance $L_3$ between the slots 43,44 and the edge of silicon substrate 40. However, the area of the silicon substrate 40 in the present invention is the same with that of the silicon substrate 30 of the prior art.

Figure 5:
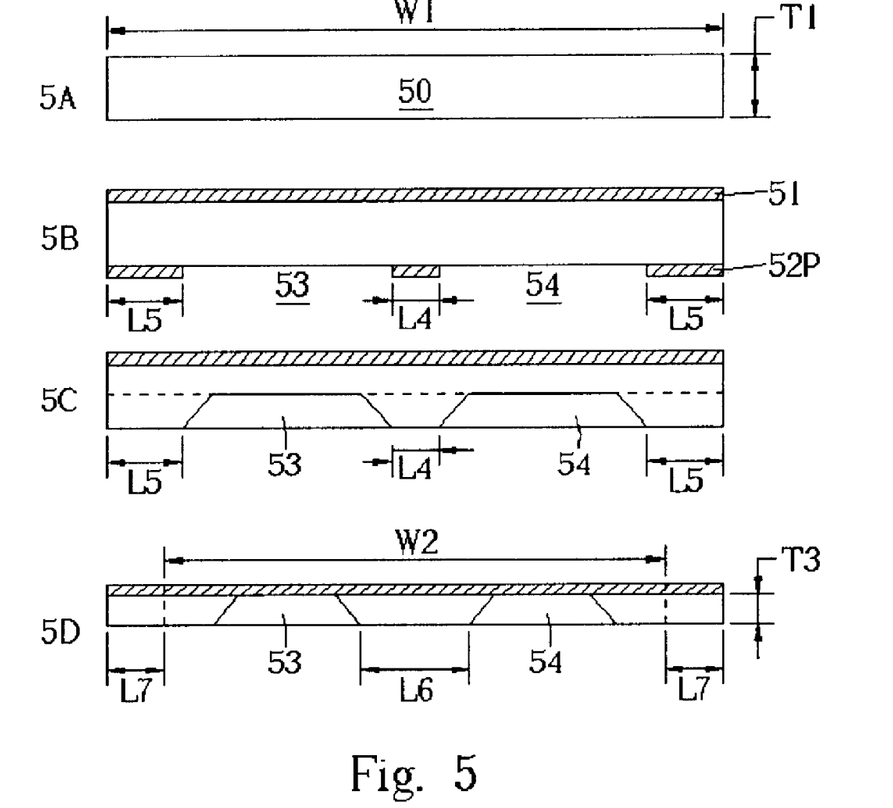
FIG. 5 is a view of a second preferred embodiment of the high density wafer production method.

Please refer to FIG. 5, which is a view of the second preferred embodiment of the present invention. A silicon substrate 50 having the same width $W_1$ and thickness $T_1$ as that shown in FIG. 1 and FIG. 4 has a passivation layer 51 and a patterned passivation layer 52P on a top surface and a bottom surface of the silicon substrate 50. Two slots 53,54 are formed on the patterned passivation layer 52P subsequently, and the distance between the slot 53 and the slot 54 is decreased to $L_4$, while retaining the same width of slots 53,54. The distance between the slots 53,54 and the silicon substrate 50 edge is $L_5$. The structure is shown in FIG. 5B. The patterned passivation layer 52P is formed by a photo-etching process. Other steps are similar with the process shown in FIG. 4. The structure is shown in FIG. 5D after performing an etching process.

In contrast to the first preferred embodiment in FIG. 4, the second preferred embodiment of the present invention largely decreases the distance $L_6$ between the slot 53 and the slot 54 ($L_6<L_2$). If the distance $L_6$ is the same as the distance $L_1$, the length $L_7$ is used for gluing to the ink box. The second preferred embodiment of the present invention decreases the width of the substrate 50 ($W_2<W_1$).

Figure 8:
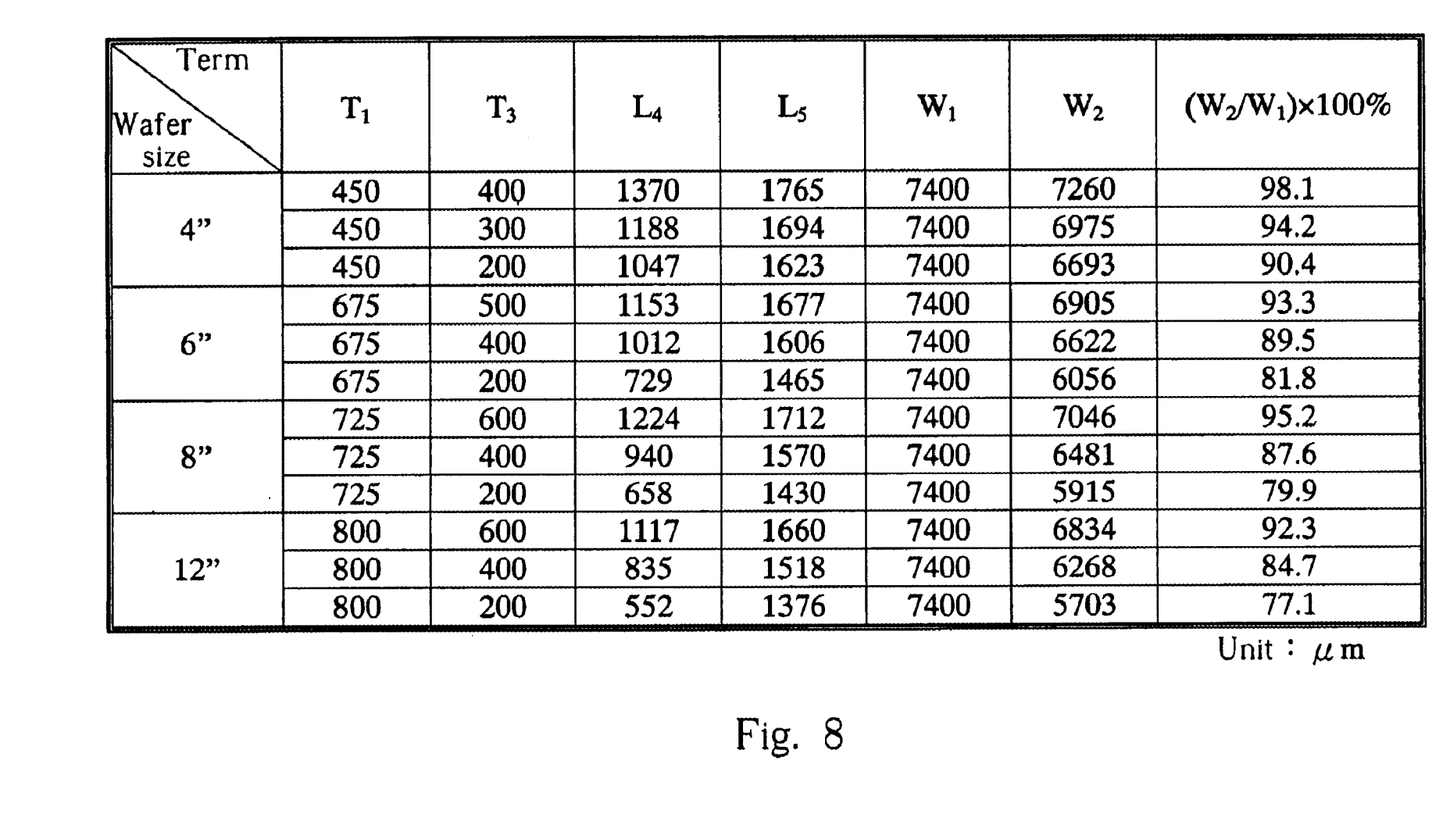
FIG. 8 shows a structure size of two slots.

FIG. 8 shows the results of the mask design pattern size L4, L5 and the silicon substrate size W2 after performing an etching process to the silicon substrate in the present invention and the prior art.

Figure 6:
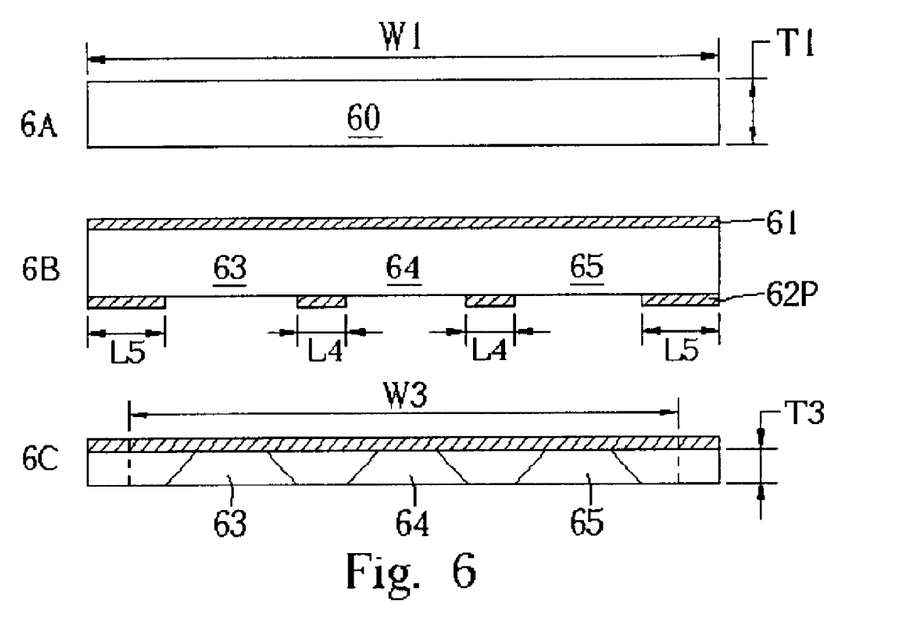
FIG. 6 is a third preferred embodiment of the high density wafer production method.

Please refer to FIG. 6, which is a view of a third preferred embodiment of the present invention: A silicon substrate 60 having the same width $W_1$ and thickness $T_1$ as that of FIGS. 1 to FIG. 5 is shown in FIG. 6A. A passivation layer 61 and a patterned passivation layer 62P are formed on a top surface and a bottom surface of the silicon substrate 60, as shown in FIG. 6B. Three slots 63,64,65 are formed on the passivation layer 62P for shortening the distances $L_1$ to $L_4$, while retaining the same width of the slots 63,64,65. The distance between slots 63,65 and the edge of the silicon wafer 60 is $L_5$. Other steps are similar to steps of the process shown in FIG. 4. The structure is shown in FIG. 6C after performing an etching process on the silicon substrate 60.

Figure 9:
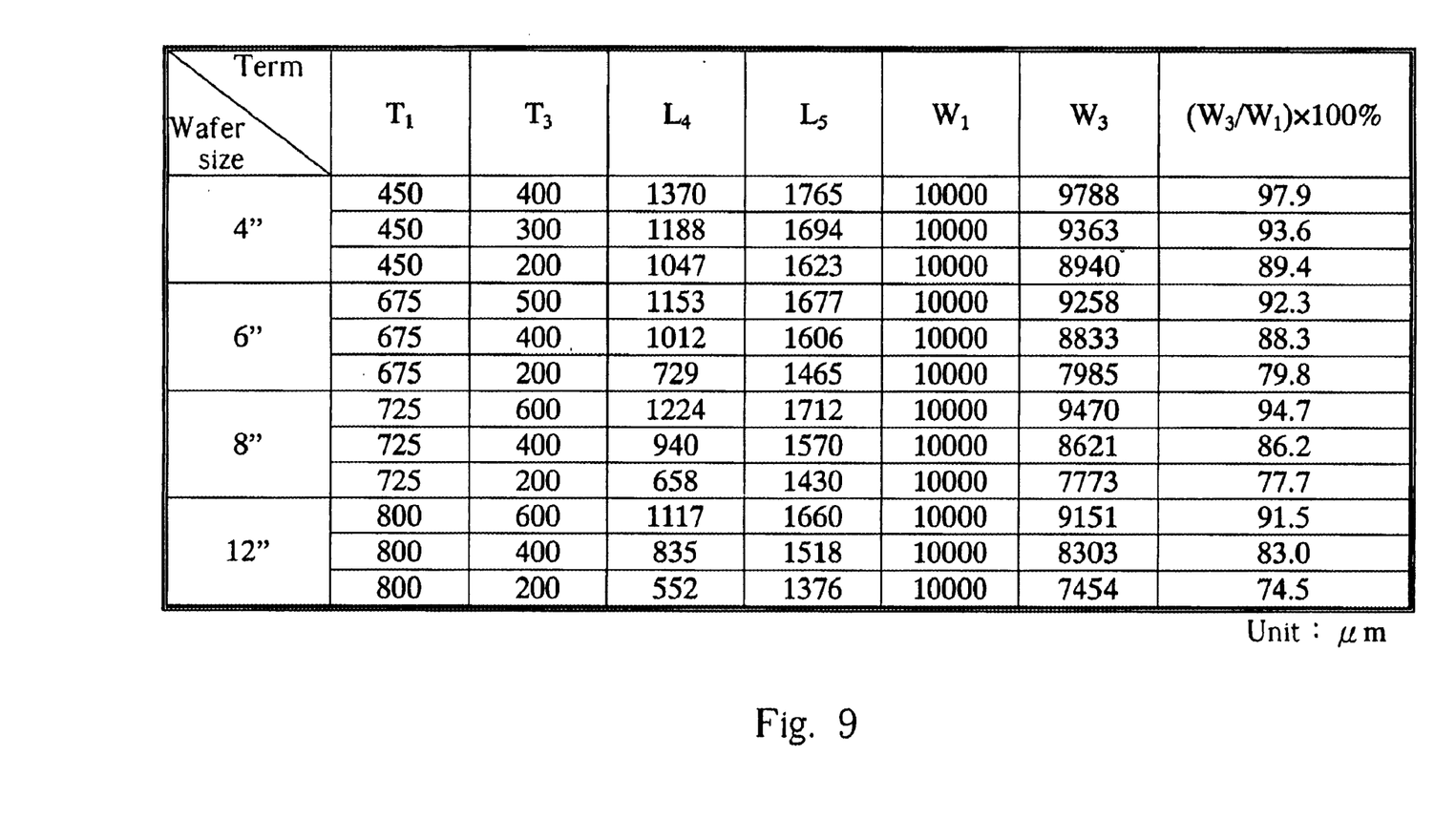
FIG. 9 shows a structure size of three slots.

FIG. 9 shows results of the mask design pattern size L4,L5 and the silicon substrate size W3 after performing an etching process to the silicon substrate in the present invention and the prior art.

Figure 7:
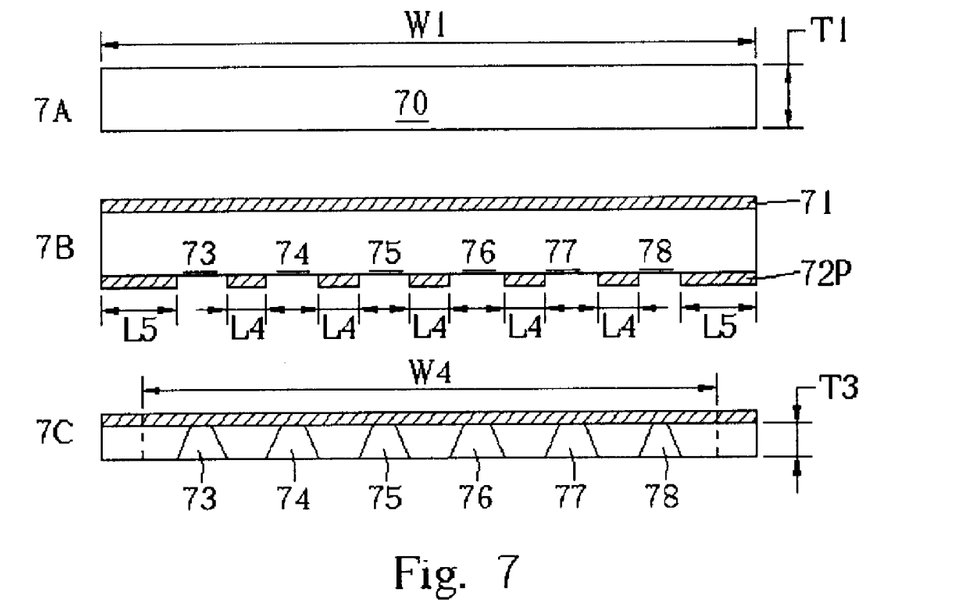
FIG. 7 is a fourth preferred embodiment of the high density wafer production method.

Please refer to FIG. 7, which is a view of the fourth preferred embodiment of the present invention. A silicon substrate 70 having the same width $W_1$ and thickness $T_1$ as that of FIGS. 1 to FIG. 6 is shown in FIG. 7A. A passivation layer 71 and a patterned passivation layer 72P are formed on a top surface and a bottom surface of the silicon substrate 70, as shown in FIG. 7B. Six slots 73,74,75,76,77,78 are formed on the passivation layer 72P for shortening the distance $L_1$ to $L_4$, while retaining the same width of the slots 73,74,75, 76,77,78. The distance between slots 73,78 and the edge of the silicon wafer 70 is $L_5$. Other steps are similar with the steps shown in FIG. 4. The structure is shown in FIG. 7C after performing an etching process to the silicon substrate 60.

Figure 10:
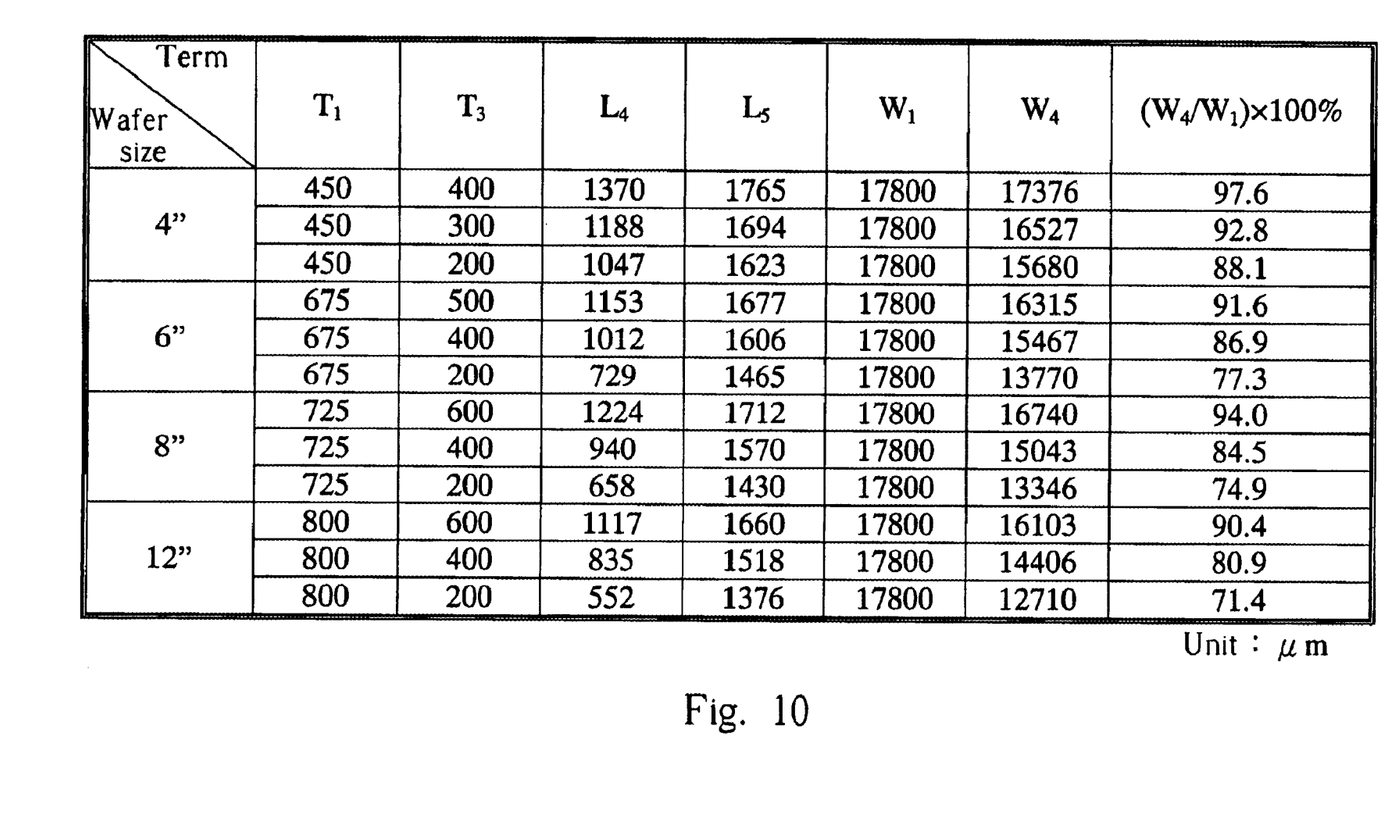
FIG. 10 shows a structure size of six slots.

FIG. 10 shows the results of the mask design pattern size L4,L5 and the silicon substrate size W4 after performing an etching process to the silicon substrate in the present invention and the prior art.

According to a fifth embodiment of the present invention, a first etching process is performed on the silicon substrate of any one preferred embodiment described before. A second etching process is performed on the unpatterned passivation layer for removing the unpatterned passivation layer. A third etching process is performed on the silicon substrate to a designed thickness. Other steps are similar with the preferred embodiment described before.

The feature of the present invention is to use two passivation layers having different etching speeds of an etching solution for fabricating a device, which reduces wafer size. When two passivation layers have the same etching speed and solution, a passivation layer is removed first for arriving at the same goal of reducing the device wafer size. The size of the wafer in the present invention changes with the thickness of the wafer. The reduction rating of the wafer increases with the slots of the pattern increasing. The present invention discloses a gradational etching process for the advantage of increasing the production yield and reducing the production cost in large wafer size and high density structure processes.

In comparison to the prior art, the method of the present invention reduces the size of a print head wafer and increases the number of slots, thereby increasing the production yield. In addition, the present invention also applies to different devices such as filtering systems, inkjet print head systems, micro channel systems and sensor systems. The gradational etching process disclosed in the present invention decreases the inclined plane effect by using an isotropic etching process. The process of the present invention is similar with the prior art, without adding complex steps for producing a similar structure and appearance to that of the designed pattern.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An etching method for high density wafer production used in an etching process of a substrate for controlling a thickness of a wafer, the etching method comprising:

forming a first passivation layer and a second passivation layer on a top surface and a bottom surface, respectively, of the substrate;

performing a photo-etching-process(PEP) to pattern the first passivation layer;

performing a first etching process to simultaneously etch the substrate and the first passivation layer; and after removing the first passivation layer, performing a second etching process to etch the substrate to a designated depth that is used to control the thickness of the wafer after the second etching process.

2. The etching method of claim 1 wherein the substrate is single crystal silicon, glass, ceramic, or metal.

3. The etching method of claim 1 wherein the first and the second passivation layer are formed of silicon oxide, silicon nitride, or materials comprising silicon.

4. The etching method of claim 3 wherein the first passivation layer and the second passivation layer are formed of the same material, and the second passivation layer is thicker than the first passivation layer.

5. The etching method of claim 3 wherein the first passivation layer and the second passivation layer are formed of different materials, and an etching rate of the second passivation layer is less than an etching rate of the first passivation layer.

6. The etching method of claim 1 wherein the first etching process is a wet etching process or a dry etching process, and the second etching process is a wet etching process, a dry etching process, or a mechanical etching process.

7. The etching method of claim 6 wherein a potassium hydroxide (KOH) solution is used as an etching solution.

8. The etching method of claim 1 wherein the first etching process and the second etching process together comprise at least one anisotropic etching process.

9. An etching method used in an etching process of a substrate for controlling a thickness of a wafer, the etching method comprising:

forming a first passivation layer and a second passivation layer on a top and a bottom of the substrate, respectively;

performing a photo-etching-process(PEP) to pattern the first passivation layer;

performing a first etching process to simultaneously etch the substrate and the first passivation layer;

removing the first passivation layer; and subsequently performing a second etching process upon the substrate for a designated length of time to etch the substrate to a designated depth that is used to control the thickness of the wafer after the second etching process.

10. The etching method of claim 9 wherein the substrate is formed of single crystal silicon, glass, ceramic, or metal.

11. The etching method of claim 9 wherein the first passivation layer and the second passivation layer are formed of silicon oxide, silicon nitride, or a material comprising silicon.

12. The etching method of claim 11 wherein the first passivation layer and the second passivation layer are formed of the same material, and the second passivation layer is thicker than the first passivation layer.

13. The etching method of claim 11 wherein the first passivation layer and the second passivation layer formed of different materials, and an etching rate of the second passivation layer is less than an etching rate of the first passivation layer.

14. The etching method of claim 9 wherein the first etching process is an anisotropic etching process.

15. The etching method of claim 9 wherein the first etching process is a wet etching process or a dry etching process.

16. The etching method of claim 15 wherein a potassium hydroxide (KOH) solution is used as an etching solution.

17. An etching method used in an etching process of a substrate for controlling a thickness of a wafer, the etching method comprising:

forming a first passivation layer and a second passivation layer on a top and a bottom of the substrate, respectively;

performing a photo-etching-process(PEP) to pattern the first passivation layer;

performing a first etching process upon the substrate;

performing a second etching process to completely etch the first passivation layer; and performing a third etching process to etch the substrate to a designated depth that is used to control the thickness of the wafer.

18. The etching method of claim 17 wherein the substrate is formed of single crystal silicon, glass, ceramic, or metal.

19. The etching method of claim 9 wherein the first passivation layer and the second passivation layer are formed of silicon oxide, silicon nitride, or a material comprising silicon.

20. The etching method of claim 17 wherein the first etching process is a wet or dry etching process, and the second etching process and the third process are wet etching processes, dry etching processes, or mechanical processes.

* * * * *